(12) United States Patent
Zhang et al.

(10) Patent No.: US 7,404,981 B2
(45) Date of Patent: Jul. 29, 2008

(54) PRINTING ELECTRONIC AND OPTO-ELECTRONIC CIRCUITS

(75) Inventors: Xiao-An Zhang, Sunnyvale, CA (US); R. Stanley Williams, Redwood City, CA (US); Yong Chen, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 308 days.

(21) Appl. No.: 10/420,565

(22) Filed: Apr. 21, 2003

(65) Prior Publication Data

US 2004/0209448 A1 Oct. 21, 2004

(51) Int. Cl.
*B05D 5/12* (2006.01)
*C23C 14/00* (2006.01)

(52) U.S. Cl. ............... 427/99.2; 427/96.1; 427/98.4; 427/523; 427/526; 427/532; 427/256; 427/372.2

(58) Field of Classification Search ............ 427/96, 427/97, 523, 526, 532, 256, 282, 372.2; 252/500
See application file for complete search history.

(56) References Cited

U.S. PATENT DOCUMENTS

| | | | | |
|---|---|---|---|---|
| 4,491,605 A | * | 1/1985 | Mazurek et al. ............ | 427/525 |
| 4,540,620 A | * | 9/1985 | Johnson et al. ............ | 428/195.1 |
| 4,822,638 A | * | 4/1989 | Yaniger ..................... | 427/79 |
| 5,176,851 A | * | 1/1993 | Barry, Jr. .................. | 252/500 |
| 5,250,388 A | * | 10/1993 | Schoch et al. .............. | 430/269 |
| 5,300,208 A | | 4/1994 | Angelopoulos et al. | |
| 5,545,308 A | | 8/1996 | Murphy et al. | |
| 6,043,336 A | | 3/2000 | Miller et al. | |
| 2003/0151028 A1 | * | 8/2003 | Lawrence et al. .......... | 252/500 |

* cited by examiner

*Primary Examiner*—Brian K Talbot

(57) ABSTRACT

A method is provided for printing electronic and opto-electronic circuits. The method comprises: (a) providing a substrate; (b) providing a film-forming precursor species; (c) forming a substantially uniform and continuous film of the film-forming precursor species on at least one side of the substrate, the film having a first electrical conductivity; and (d) altering portions of the film with at least one conductivity-altering species to form regions having a second electrical conductivity that is different than the first electrical conductivity, the regions thereby providing circuit elements. The method employs very simple and continuous processes, which make the time to produce a batch of circuits very short and leads to very inexpensive products, such as electronic memories (write once or rewriteable), electronically addressable displays, and generally any circuit for which organic electronics or opto-electronics are acceptable.

3 Claims, 2 Drawing Sheets

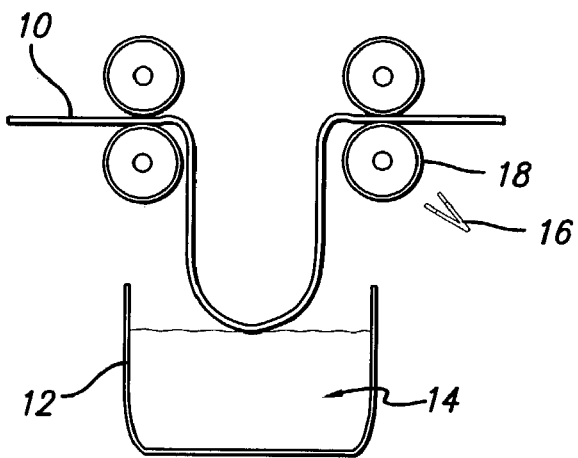
FIG. 1a
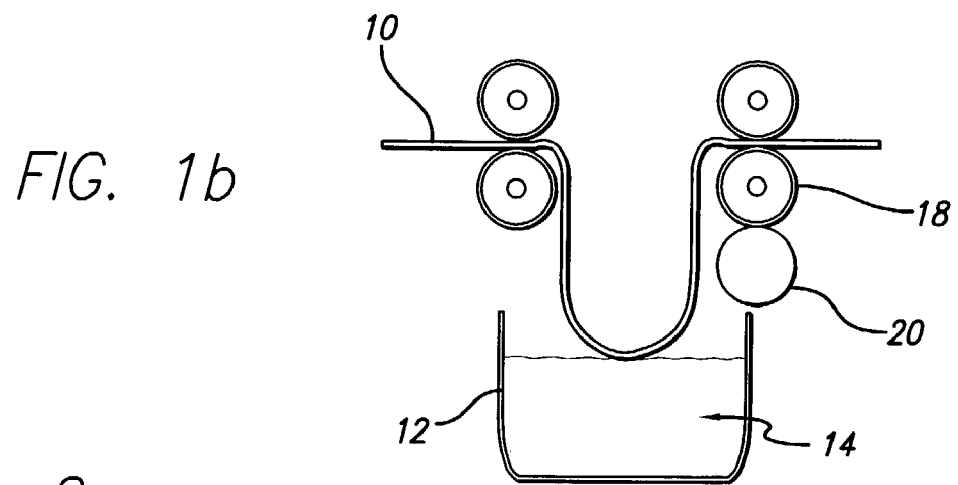
FIG. 1b
FIG. 2a
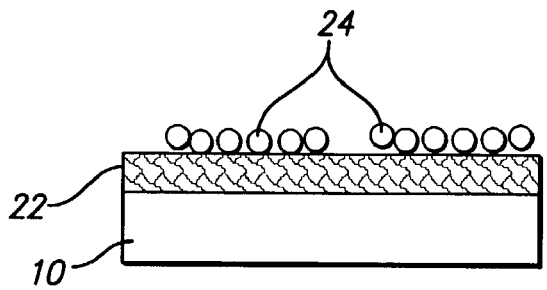
FIG. 2b
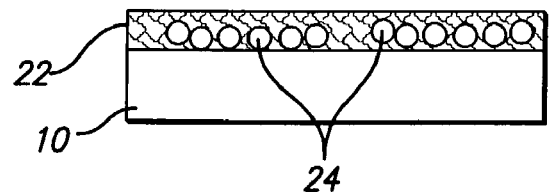

PRINTING ELECTRONIC AND OPTO-ELECTRONIC CIRCUITS

TECHNICAL FIELD

The present invention relates generally to the fabrication of electronic and opto-electronic circuits.

BACKGROUND ART

In today's electronic technology, integrated circuits are currently built by a process consisting of multiple steps of lithography followed by deposition and/or etching procedures. Each step requires a significant amount of time to perform, and the waiting time between steps can be long. The total time required to produce a batch of devices can be weeks. Thus, the process is time-consuming, and in addition, the environmental and safety concerns associated with toxic chemical materials that are usually involved and released during the process ultimately make the process very expensive.

Electrically conducting organic polymers have been of scientific and technological interest since the late 1970's. These relatively new materials exhibit the electronic and magnetic properties characteristic of metals while retaining the physical and mechanical properties associated with conventional organic polymers. These polymers are conjugated systems that are made electronically conducting by doping. Even though conducting polymers have the potential for a large number of applications in such areas as electrostatic charge/discharge protection, electromagnetic interference shielding, resists, electroplating, corrosion protection of metals and ultimately metal replacement, the lack of processability of conducting polymer materials (because of their insolubility in the conducting form), infusibility, and poor mechanical properties, e.g., ductility, have slowed down their emerging commercial applications.

To date, there have been only two interesting demonstrations of using conducting organic polymer in the fabrication of printed circuit boards through direct metallization process on non-conducting substrates. The primary problem with those two processes is that they still use conventional lithography methods and through-hole plating techniques, and they are still time-consuming because of the number of steps and long waiting time between steps.

Thus, what is needed to produce high quality circuit boards at competitive prices is a process that keeps production costs down, and this in turn means less consumption of environmentally toxic chemicals, reduced number of manufacturing steps, shorter process times, and a greater need for automation.

DISCLOSURE OF INVENTION

In accordance with the embodiments disclosed herein, a method is provided for printing electronic and opto-electronic circuits. The method comprises:
providing a substrate onto which at least one circuit will be formed;
providing a film-forming precursor species;
forming a substantially uniform and continuous film of the film-forming precursor species onto a surface of the substrate, the film having a first electrical conductivity; and
altering portions of the film with at least one conductivity-altering species to form regions having a second electrical conductivity that is different than the first electrical conductivity, the regions thereby providing circuit elements for the electronic and opto-electronic circuits.

The present teachings provide a means for printing complex multi-layer electronic or opto-electronic circuits onto a plastic substrate with very simple and continuous processes. This makes the time to produce a batch of circuits reasonably short and leads to very inexpensive products, such as electronic memories (write once or rewriteable), electronically addressable displays, and generally any circuit for which organic electronics or opto-electronics are acceptable.

The present disclosure avoids those traditional lithography-deposition-etching methods, minimizes environmental toxic chemicals usage, simplifies the manufacturing processes, and allows organic materials with appropriate electronic or opto-electronic properties to be printed onto a flexible substrate to produce complex two- and three-dimensional structures that will enable circuits of essentially arbitrary complexity to be built.

BRIEF DESCRIPTION OF THE DRAWINGS

FIG. 1a is a side elevational view of a schematic process used in one embodiment taught herein;

FIG. 1b is a side elevational view of a schematic process used in a second embodiment taught herein;

FIGS. 2a-2b are side elevational views depicting the formation of dopants (or de-dopants) on the surface of a molecular layer (FIG. 2a) and the resulting structure following driving the dopants (or de-dopants) into the molecular layer (FIG. 2b) in a first embodiment;

BEST MODES FOR CARRYING OUT THE INVENTION

Figure 3A:
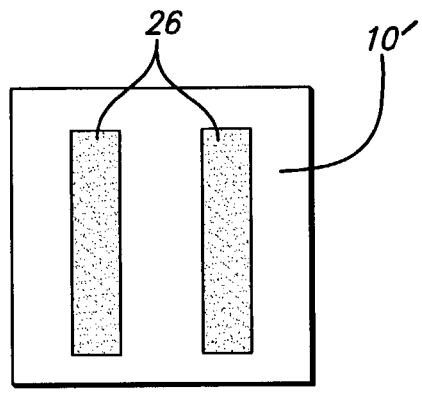
FIGS. 3a-3c are a top plan view (FIG. 3a) and side elevational views (FIGS. 3b-3c) of a second embodiment of a process disclosed herein.

The embodiments disclosed and claimed herein rely on a significant property, that some tunable organic polymers such as polyconjugated large molecules (e.g., emeraldine, etc.) or small molecules such as perylene, are essentially insulating in their undoped state (or de-doped state), but they become conducting and/or semiconducting when they are doped with the appropriate electron acceptors or donors. Electron acceptors include oxidizing reagents, (e.g., halogens, silver nitrate, etc.) and Lewis acids (e.g., sulfuric acid, aluminum chloride, etc.), whereas electron donors include reducing reagents (e.g., alkali metals, $Na_2S_2O_4$, etc.; see, e.g., U.S. Pat. No. 6,043,336, issued Mar. 28, 2000, to Larry L. Miller et al) and Lewis bases (ammonia, pyridine, etc.).

Thus, one can deposit a thin film of such a polymer (e.g., 1 to 50 wt % of emeraldine solution in N-methyl-2-pyrrolidone (NMP) onto a substrate film of some type, such as by spin coating or dipping, and then create a circuit within the film by printing a pattern of wires and devices onto the polymer or molecular layer with the appropriate dopant species (e.g., p-toluene sulfuric acid or analogs in water or organic solvents). The printing process can be performed by conventional xerographic procedures, by laser printing, ink jet printing (e.g., solid jet, bubble jet, piezo jet, etc.), by contact printing, or by a combination of these techniques to produce arbitrarily complex designs in two dimensions dopants. Multiple layers can be created on top of one another to make arbitrarily complex three-dimensional circuits. Such a process can be used for depositing electronic circuits, such as a cross-point memory, light emitting diode arrays for displays, or hybrid opto-electronic circuits made from materials such as polymer or molecular thin films.

The polymeric or molecular thin film can be prepared via a number of conventional thin film preparation methods, such as, but not limited to, spin coating, bar coating, roller coating, and thermal molding, etc. For example, a thin film of poly (phenylene sulfide) can be prepared by a hot melting or thermal molding method. In the case of using spin coating, bar coating, or roller coating, etc., the polymeric or molecular species (including polymeric binder) is dissolved in a single solvent or a mixture of solvents. For the preparation of thin films, the dissolving solvents(s), which are known for the various polymeric or molecular species, must have a reasonable volatility. Ideally, the boiling point of the solvent(s) should be below 200° and solvent(s) should be easily removed from the thin layer either by a vacuum and/or thermal evaporation, or by solvent extraction, or by a combination of both. An exemplary list of solvents useful to practice the present invention includes, but is not limited to, N-methyl pyrrolidinone (NMP), 2-pyrrolidinone (2P), dimethyl formamide (DMF), dimethyl acetamide, dimethyl sulfoxide (DMSO), toluene, xylene, acetone, methyl ethyl ketone, cyclohexanone, tetrahydrofuran, methylene chloride (DOM), chloroform, phenol, benzyl alcohol, acetic acid, and water. Additionally, one or more monomers of conducting polymers (the same conducting polymer or a different one) can be used as the dissolving solvent(s). Examples include, but are not limited to, aniline, phenol, thiophenol, phenyl acetylene, thiophene, pyrrole, furan, isothianaphthene, etc.

During the thin film preparation, the active polymeric or small molecular precursors can be used alone or in a combination with some inert copolymer(s) polymer(s) or binder(s). In the context used herein, the term "active precursor", particularly when used with polymers, is to differentiate the polymeric thin film from the polymeric web, or substrate, which is merely used as a support.

The copolymer(s) or binder(s) are employed when the active precursor cannot form a uniform thin film alone or the precursor is not soluble and needs to be blended with some binder(s) or copolymer(s) to improve its processability or thin film quality for thin film preparation. For example, polyacetylene itself is a very insoluble substance and can only be prepared in situ. However, some soluble forms of polyacetylenes can be synthesized by attaching solubilizing group(s) to $(CH)_x$. The attachment(s) occur on the $(CH)_x$ chain and can be varied to provide the desired polymer-solvent interactions. It is preferable to attach the second polymer at the terminus of $(CH)_x$ to preserve the symmetry and desirable properties of the $(CH)_x$ segment. Some of the grafted copolymers used include, but are not limited to, polystyrene, polyisoprene, and polybutadiene, and the like.

The thickness of the thin film essentially ranges from a few nanometers to many microns, depending on the application. The thin film does not have to be thin, but can be very thick and thus form an insulating substrate for the circuit elements formed by the doping species, which only diffuse a small way into the film.

The methods for printing electronic and opto-electronic circuits disclosed herein can be classified into two categories. The first category is a positive printing method, while the second category is a negative printing method. Both methods use a conductivity-altering species; the former method employs a dopant, while the latter method employs a de-dopant. The conductivity-altering species changes the conductivity of the regions it contacts.

The basic concept of the positive printing method is to convert part of a non-conductive or less conductive polymeric or small molecular (including pre-crosslinked monomeric) thin film into a conductive circuit path by doping it via various printing techniques. The basic concept of the negative printing method is to convert part of the conductive polymeric or small molecular thin film into a less conductive or non-conductive path involving a de-doping process via various printing techniques to create the desired circuits.

Positive Printing Method.

In the positive printing method, a non-electrically-conducting thin film of at least one undoped "active precursor", which may be a polymeric species or a small molecular species, is formed on a polymer web, or substrate. As used herein, the term "small" with reference to "molecule" means a single or mixed molecule, including an oligomer, with less than 100 atoms in its structure, for which the structure can be trivially determined using x-ray or NMR techniques, as is conventional.

The positive printing method can be performed by a variety of techniques, discussed above, including forming the thin film directly from the polymeric or small molecular species or dissolving the polymeric or small molecular species in at least one solvent, optionally with at least one binder. The resulting solution is then processed to deposit the polymeric or small molecular species on the polymer web, as described above. The polymeric species, or small molecular species, has a first electrical conductivity.

Following formation of the thin film, portions of the thin film are next printed with a dopant to form doped regions in the thin film that have a second electrical conductivity. The doped portions are formed in a predetermined pattern to provide various circuit elements, as discussed above. The second electrical conductivity is at least two orders of magnitude greater than that of the first electrical conductivity.

For polymeric substances as active precursors, an exemplary list of the polymers includes, but is not limited to, polyaniline (PANi), substituted polyaniline or block copolymers of polyaniline; polypyrrole (Ppy), substituted polypyrrole or block copolymers of polypyrrole; polythiophene (PT), substituted polythiophene or block copolymers of polythiophene; polyisothianaphthene (PITN), substituted polyisothianaphthene or block copolymers of polyisothianaphthene; polyparaphenylene (PPP), substituted polyparaphenylene or block copolymers of polyparaphenylene; polythienylene vinylene (PTV), substituted polythienylene vinylene or block copolymers of polythienylene vinylene; polyparaphenylene vinylene (PPV), substituted polyparaphenylene vinylene or block copolymers of polyparaphenylene vinylene; polyacetylene (PA), substituted polyacetylene or block copolymers of polyacetylene; and poly(phenylene sulfide) (PPS), substituted poly(phenylene sulfide) or block copolymers of poly(phenylene sulfide), etc.

For small molecules as active precursors, an exemplary list of the molecules includes, but is not limited to, perylene (per) or substituted perylene, tetracyano-p-quinodimethane (TCNQ) or substituted TCNQ, tetracyanonaphthalene (TNAP) or substituted TNAP, tretrathiafulvalene (TTF) or substituted TTF (e.g., bis(ethylenedithio)-tretrathiafulvalene (BEDT-TTF), etc.), tetraselenafulvalene (TSF) or substituted TSF (e.g., tetramethyltetraselenafulvalene (TMTSF) and hexamethylenetetraselenafulvalene (HMTSF), etc.)

If solvent-based formation of the thin films is performed, the solvents, one or more of the solvents discussed above may be used.

The optional binder(s) used for blending with the active precursor and solvent for thin film preparation can be any of the conventional binders. An exemplary list of the precursors includes, but is not limited to, poly(vinyl alcohol) (PVA), poly(vinyl pyrrolidinone (PVP), gelatin, cellulose acetate, cellulose acetate butyrate, polyethylene glycolbutyl stearate, vinyl acetate/vinyl alcohol copolymer, methyl vinyl ether/maleic acid copolymer, polysiloxane, polystyrene, poly(methyl methacrylate), and copolymers containing acrylate or methacrylate, etc.

There are various methods available for doping either polymeric or molecular thin films, such as, but not limited to, (a) doping with gaseous vapors; (b) doping by oxidizing cations; (c) photo-initiated doping; (d) solution doping; (e) chemical-reaction (including electrochemical reaction) doping, etc. Both solution doping and chemical-reaction doping are preferred herein.

In the case of solution doping, the concentration of dopant(s) in the solution of some conventional solvent(s) must be in the range of about 1 to 50 wt %, and can be varied depending on the application and the properties desired. The solvent(s) used for dissolving the dopant(s) should not back-dissolve the precursor on the thin film. Ideally, the doping solvent should only swell the thin layer precursor (but not dissolve it) to ensure a smooth penetration of dopant into the solid thin layer. An exemplary list of solvents useful to practice the present invention includes, but is not limited to, the same list of solvents as above, with the caveat that the solvent used to dissolve the dopant is not the same one that is used above to dissolve the precursor.

In the case of chemical-reaction doping, electronic conductivity changes can be achieved by oxidation or reduction through basic redox reactions; this is very common for doping polymeric thin films through electrical doping. The doping process may involve a charge-transfer reaction. There are two types of doping in the charge-transfer reaction: p-type or n-type. In p-type of doping, doping is performed with an electron acceptor (e.g., $I_2$), whereby a monovalent anion and a stabilized polycarbonium ion are created. For example, in the case of doping polyacetylene, the dopant removes the free spin (neutral solitons) for $(CH)_x$ and converts it to a positive soliton (Eqn. 1). Here, conduction involves positive charge carriers (holes).

$(CH)_x + 3/2\, y\, I_2 \rightarrow (CH)_x^{y+} + y\, I_3^-$      Eqn. 1

$(CH)_x + Li \rightarrow (CH)_x^{y-} + y\, Li^+$      Eqn. 2

In the n-type of doping, doping is performed with an electron donor (e.g., Li), whereby a monovalent cation and a stabilized polycarbanion are formed. In this case, an electron is added to the neutral soliton converting it to a negative soliton (Eqn. 2). Here, conduction involves negative charge carriers (electrons).

For doping polymeric thin films, an exemplary list of the dopant(s) useful in the practice of the present embodiments includes, but is not limited to, $I_2$, $Br_2$, $AsF_5$, $SbF_5$, $LiAlH_4$, $NaBH_4$, $NaH$, $LiH$, $CaH_2$, butyl lithium, $H_2SO_4$, $HClO_4$, $KMnO_4$, $H_2O$, toluenesulfonic acid, polystyrene sulfonic acid, organic peracid or mineral peracid, sodium naphthalide, alkali metal or amine salts that contain $NO^+$, or $NO_2^+$ ions, and triarylsulfonium and diaryliodonium salts, etc.

Doping small conjugated molecules to increase their conductivity involves a charge transfer reaction. Charge transfer complexes are created via doping. If the molecular substrate(s) in the base of thin film are electron efficient molecules (electron donors, e.g., perylene), the dopant should be some electron deficient species (electron acceptors, e.g., $I_2$), and vice versa. An exemplary list of the dopant(s) useful in the practice of the present embodiments includes, but is not limited to, $I_2$, $Br_2$, $AsF_5$, $SbF_5$, metal hexaflurophosphate, metal perchloriate, metal triiodide, tetracyano-p-quinodimethane (TCNQ) or substituted TCNQ; tetracyanonaphthalene (TNAP) or substituted TNAP; tretrathiafulvalene (TTF) or substituted TTF (e.g., bis (ethylenedithio)-tretrathiafulvalene (BEDT-TTF), etc.); tetraselenafulvalene (TSF) or substituted TSF (e.g., tetramethyltetraselenafulvalene (TMTSF), hexamethylenetetraselenafulvalene (HMTSF), etc).

As the result of this positive printing, the area that has been exposed to the dopant becomes more conductive (at least 3 orders more conductive), while the unexposed part remains non-conductive to thereby provide a desired circuit.

Negative Printing Method.

In the negative printing method, an electrically conductive thin film of at least one doped "active precursor", which may be a polymeric species or a small molecular species, is formed on a polymer web, or substrate. This can be done by a variety of techniques, discussed above, including forming the thin film directly from the doped polymeric or small molecular species or dissolving the doped polymeric or small molecular species in at least one solvent, optionally with at least one binder. The resulting solution is then processed to deposit the doped polymeric or small molecular species on the polymer web, as described above. The doped polymeric species, or small molecular species, has a first electrical conductivity.

Following formation of the thin film, portions of the thin film are next de-doped (e.g., the doped portions are neutralized to reduce the conductivity thereof) to form de-doped regions in the thin film that have a second electrical conductivity. The de-doped portions are formed in a predetermined pattern to provide various circuit elements, as discussed above. In this case, the second electrical conductivity is at least two orders of magnitude less than that of the first electrical conductivity.

Thus, the concept of the negative printing method is to convert part of the conductive polymeric or small molecular thin film into less conductive or non-conductive paths by involving a de-doping process via various printing techniques to create the desired circuits. The basic principle of de-doping is to remove any conductive charge carriers from the active substrate(s), either chemically or electrochemically. The chemical de-doping involves inserting some de-dopant(s) into the thin layer via various printing techniques. The de-dopant(s) is(are) chemical(s) that can quickly react with doped substrate(s) to extract any charged solitons out of the active substrate or convert them to neutral solitons by exchanging themselves into some kind of non-conductive charged species. One example of this is the poly(3,4-ethylenedioxythiophene) (PEDT)/poly(styrene sulfonate)(PSS) conducting polymeric system (Formula I below). The conductive thin film of doped PEDT/PSS is prepared by spin coating of a commercially available material in aqueous solution. The de-dopant (either a saturated aqueous sodium sulfide solution, or a saturated aqueous $Na_2S_2O_3$ solution) is inserted into the film by either an inkjet or contact printing method. The de-dopant will react with the conductive polymer immediately to remove any charge carriers (positive solitons) from the poly(thiophene) backbone.

For polymeric substances as active precursors, an exemplary list of the precursors includes, but is not limited to, doped polyaniline (PANi), doped substituted polyaniline or doped block copolymers of polyaniline; doped polypyrrole (Ppy), doped substituted polypyrrole or doped block copolymers of polypyrrole; doped polythiophene (PT), doped substituted polythiophene or doped block copolymers of polythiophene; doped polyisothianaphthene (PITN), doped substituted polyisothianaphthene or doped block copolymers of polyisothianaphthene; doped polyparaphenylene (PPP), doped substituted polyparaphenylene or doped block copolymers of polyparaphenylene; doped polythienylene vinylene (PTV), doped substituted polythienylene vinylene or doped block copolymers of polythienylene vinylene; doped polyparaphenylene vinylene (PPV), doped substituted polyparaphenylene vinylene or doped block copolymers of polyparaphenylene vinylene; and doped polyacetylene (PA), doped substituted polyacetylene or doped block copolymers of polyacetylene.

As the result of this negative printing, the area that has been exposed to the de-dopant becomes less conductive (2 to 6 orders less conductive), while the unexposed part remains conductive to thereby provide a desired circuit.

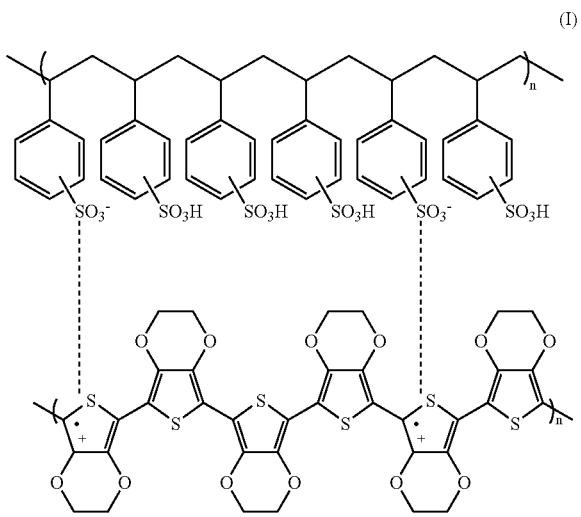

(I)

The de-dopant can be any chemical(s) that is(are) capable of neutralizing the charges in the conductive polymeric backbone or small charge complex molecular thin film, either through a reversed redox reaction, or substitution or addition, etc. An exemplary list of the de-dopant(s) includes, but is not limited to, amine, imine, phenol, thiol, metal hydride, sulfide, sulfite, bisulfite, metabisulfite, or any inorganic oxidizing reagent, etc. The de-dopant can be used as neat (if is liquid at room temperature and atmosphere pressure), or in aqueous or organic solvent solution. An exemplary list of solvents useful in the practice of the present embodiments includes, but is not limited to, the same list of solvents as above. However, the solvent used for de-dopant is preferably not the same as the one used for preparation of polymeric thin film mentioned above.

Printing Processes.

FIGS. 1-3 are schematic drawings depicting how this process works by using conjugated polymers or small molecules to prepare the thin film first, then using various printing processes to dope the thin film to create the desired electronic circuits. It is worth noticing that the specific examples of this positive printing process described below use doping as a preferred way to create the molecular electric circuits. However, the reverse process (a negative printing method) is possible even though it is not explicitly referred to here. The reverse process is to use the de-doping process to convert part of the electrically conductive-doped polymeric thin film into less conductive (or no conductive) regions via various printing techniques. This example is only illustrative of the preferred embodiment, which achieves the objects, features, and advantages of present embodiments, and it is not intended that the present invention be limited thereto.

One embodiment of this process is illustrated in FIGS. 1a-1b, which show a continuous roll process. A roll of a suitable plastic film 10 can be sent through a series of coating and printing processes such as that shown to build up an arbitrarily complex circuit. The printing step can be performed by a normal roll transfer process such as utilized in xerography or laser printing, or it can be printed directly with ink jet techniques, or it can utilize a permanent pattern on a roll to transfer the dopants (or de-dopants), such as with a mold, or it can utilize a combination of techniques, such as using multiple ink jet heads to create highly controlled patterns of different dopants (or de-dopants) onto a roll with a pattern on the roller, which is then transferred to the plastic substrate. This latter procedure can be utilized to create extremely complex circuitry very inexpensively.

One embodiment of the printing process for electronic and opto-electronic electronic circuits on plastic films involves processing the coating on a continuous basis using rollers, and there may be many processing stations 12 such as that illustrated in FIGS. 1a-1b. The film 10 is dipped in a coating solution 14 to deposit a layer (not shown in FIG. 1, but denoted as 22 in FIGS. 2a-2b) of molecules (including pre-cross-linked monomers) or polymer. The layer 22 in this as-deposited state is insulating (or electrically conducting, if using de-dopants). Referring to FIG. 1a, an array of ink jet nozzles 16 is used to spray a coarse pattern of different dopant (or de-dopant) species 24 onto a roller 18, onto which has been etched or embossed a finer pattern that is used to print the dopant (or de-dopant) onto the film. The process above can be repeated many times to build an arbitrarily complex three-dimensional structure. The resultant structure, with dopant (or de-dopant) 24 on the surface of the layer 22, is shown in FIG. 2a.

The dopant (or de-dopant) 24 is then driven into the layer 22 by any conventional process, such as heating. If heating is employed, a temperature within the range of 60° to 250° C. is preferably employed. The resultant structure, with dopant (or de-dopant) 24 within the layer 22, is shown in FIG. 2b. At this stage, the conductivity of the layer 22 has increased (or decreased) dramatically, by at least two orders of magnitude.

The polymer film 10 used in the practice of the present embodiments may comprise any of the electrically insulating substrate materials commonly used as webs, including, but not limited to, mylar, polystyrene, polyamide, polycarbonate, etc.

The following requirements must be met to ensure the success of the process:

The precursor employed (either a polymer or a small conjugated molecule) for the layer 22 must have a significant difference of electrical conductivity (preferably, 2 to 11 orders of magnitude difference in conductivity) in its doped and undoped (or de-doped) states. A list of polymeric or small molecular precursors is given above in connection with both the positive and the negative printing methods.

In their thin film preparation state, the precursors for layer 22 must have a reasonable solubility in certain organic or inorganic solvents, including monomers of conducting polymers, to ensure a smooth thin film preparation. Preferably, the solubility of precursor should be in the range of about 3 to 50 wt % in a given solvent. The thickness of the thin layer 22 can be tuned by the concentration of the precursor or speed of spin casting, etc., based on present expectation and usage.

The dissolving solvent(s) for preparation of layer 22 must be have reasonable volatility, and preferably, its boiling point should be below 200° C. and it should be easily removed from the thin layer either by vacuum and/or thermo evaporation, by solvent extraction, or by a combination of both. An exemplary list of solvents useful to practice the present embodiments has been provided above.

The concentration of dopant(s) (or de-dopants) 24 in the layer 22 must be in the range of about 1 to 50 wt % with respect to the total layer composition, and can be varied depending on the application and the properties desired. The dopant (or de-dopant) 24 can be either an oxidizing reagent, or a reducing reagent, or a Lewis acid, or a Lewis base, or a combination of two or more of these. A list of dopants is given above in connection with the positive printing method, both for doping polymeric thin films and for doping small conjugated molecules, while a list of de-dopants is given above in connection with the negative printing method, both for de-doping polymeric thin films and for de-doping small conjugated molecules.

The solvent(s) used for dissolving the dopant(s) (or de-dopant(s)) 24 should not dissolve the precursor on the thin layer 22. Ideally, the doping (or de-doping) solvent should only swell the thin layer precursor (but not dissolve it) to ensure a smooth penetration of dopant (or de-dopant) 24 into the solid thin layer 22. An exemplary list of solvents useful to practice the present invention includes, but is not limited to, the same list of solvents as above. However, the solvent used for dissolving the dopant (de-dopant) is not the same as the one used to dissolve the precursor.

The amount of dopant(s) (or de-dopant(s)) solution should be minimized to just enough for penetrating through the thin layer 24 without unnecessary or excessive sideways diffusion. The preferred droplet size used in the ink-jet printing method should be 1 pl or less. The dopant (or de-dopant) molecule 24 should be small enough to penetrate through the solid thin layer 22, and react rapidly with the polymer (or small molecule) to form a stable complex that produces a long-lasting device.

Essentially the same considerations apply where the conductivity-altering species is a de-dopant instead of a dopant, except that the minimum conductivity change between the doped and undoped states is at least two orders of magnitude.

The dopant (or de-dopant) patterns can alternatively be generated by laser-jet printing, as illustrated in FIG. 1b. The pattern can be written directly by laser on a drum 20, similar to the technology for laser-jet printing. Then the charged drum 20 can absorb dopants (or de-dopants) 24 on the patterned areas, and eventually the pattern can be transferred to the thin layer 22, in a continuous-roll process, using the roll 18, as shown in FIG. 1b.

Figure 3B:
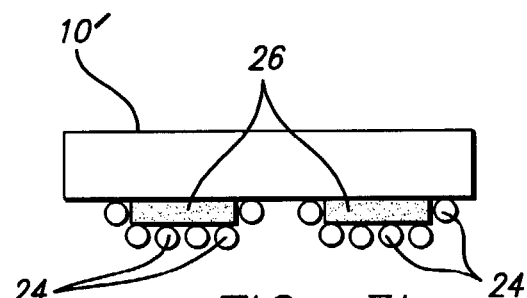
Figure 3C:
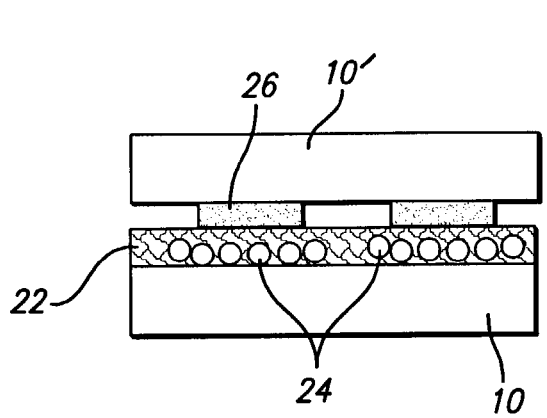

Ink-jet and laser-jet printing methods can provide low-cost process and flexibility to make custom-designed circuits. In order to achieve finer structures, it is important to control the location of the dopants (or de-dopants) 24 and their diffusion into the polymer (or-small molecule) thin layers 22. The following are additional examples of methods to control dopant (or de-dopant) distribution and selectively dope (or de-dope) polymer (or small molecule) thin films:

Conductive patterns 26 can be made on an insulating substrate 10' by conventional methods (FIG. 3a). With a slightly alternative method, patterns at the nanometer scale can be achieved. A voltage can be applied to the conductive patterns to selectively absorb dopants (or de-dopants) 24 to the conductive areas (FIG. 3b). During the printing process, the dopants (or de-dopants) 24 can be transferred to the polymer (or small molecule) thin layer 22 (FIG. 3c). In order to reduce lateral diffusion of the dopants (or de-dopants) 24 and enhance the vertical diffusion of dopants (or de-dopants) into the polymer (or small molecule) thin layer 22, an electrical field can be applied vertically between the conductive patterns and the second electrode (not shown) under the polymer thin layer, which can charge the dopants (or de-dopants) and drive the dopants (or de-dopants) to diffuse vertically into the polymer (or small molecule) thin layer.

Figure 4A:
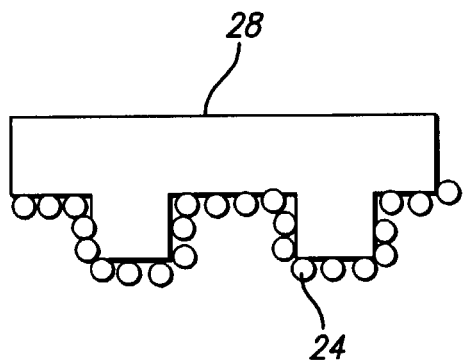
FIGS. 4a-4b are side elevational views of a third embodiment.
Figure 4B:
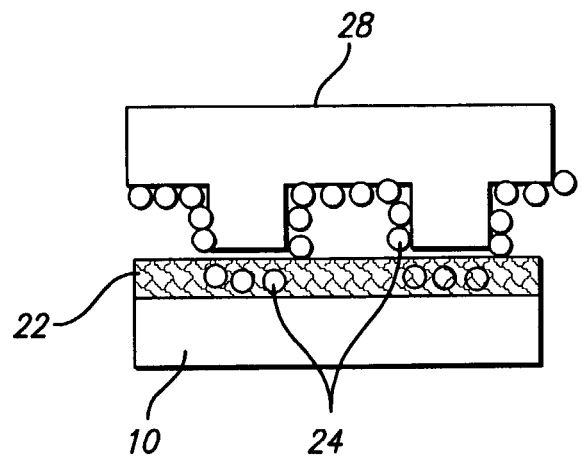

A mold 28 with non-planar patterns shown in FIG. 4a can also be fabricated by conventional methods. The entire mold 28 can be coated with dopants (or de-dopants) 24. During the printing process, only the dopants (or de-dopants) 24 in the contact areas 28a (the protrusive areas in the mold) are transferred into the polymer (or small molecule) thin layers 24 (FIG. 3b).

The substrate 10, 10' may comprise any conventional substrate material, whether flexible or rigid. In many instances, processing will dictate which kind of material will be used. For example, for the process illustrated in FIGS. 1a-1b, a flexible material, as disclosed above, is preferably employed.

INDUSTRIAL APPLICABILITY

The methods disclosed herein for printing electronic and opto-electronic circuits are expected to find use in a variety of printed circuit applications, such as polymer LEDs for large displays, continuous-roll processes for solar cells, etc.

What is claimed is:

1. A method for printing circuits selected from the group consisting of electronic circuits and opto-electronic circuits, said method comprising:

providing a substrate onto which at least one said circuit will be formed;

providing a film-forming precursor species;

forming a substantially uniform and continuous film of said film-forming precursor species onto a surface of said substrate, said film having a first electrical conductivity;

printing at least one conductivity-altering species on portions of said film to form regions having a second electrical conductivity that is of a different value than that of said first electrical conductivity, but of the same conductivity type, said regions thereby providing circuit elements for said circuits, wherein said printing is performed by a process including passing said film-coated substrate over a patterned mechanism such that said patterned mechanism contacts said film with a first conducting state, wherein said patterned mechanism is selected from the group consisting of (a) patterned rollers, (b) ink jet patterning, (c) mold patterning, and combinations thereof, said patterned mechanism having a predetermined pattern of at least one electrical conductivity-altering species thereon, said predetermined pattern being transferred to said film to form said regions of a second conductivity;

driving said at least one conductivity-altering species into said regions of said film to thereby provide said regions in said layer having said second electrical conductivity;

forming conductive patterns on said substrate film prior to forming said thin film thereon;

applying a voltage to said regions to selectively absorb said conductivity-altering species on said regions;

placing said regions with said at least one conductivity-altering species thereon in contact with said thin film; and transferring said at least one conductivity-altering species to said thin film.

2. The method of claim 1 wherein said polymer layer is provided with an array of second electrodes under said polymer layer.

3. The method of claim 2 wherein an electrical field is applied vertically between said conductive patterns and said array of second electrodes, which charges said dopants and drives said dopants to diffuse vertically into said polymer layer.

* * * * *

UNITED STATES PATENT AND TRADEMARK OFFICE
CERTIFICATE OF CORRECTION

PATENT NO. : 7,404,981 B2  
APPLICATION NO. : 10/420565  
DATED : July 29, 2008  
INVENTOR(S) : Xiao-An Zhang et al.

Page 1 of 1

It is certified that error appears in the above-identified patent and that said Letters Patent is hereby corrected as shown below:

In column 2, line 54, delete "pyrrolidone" and insert -- pyrrolidonone --, therefor.

In column 2, line 64, after "dimensions" insert -- with one or more --.

In column 3, line 13, delete "solvents(s)" and insert -- solvent(s) --, therefor.

In column 3, line 16, delete "200°" and insert -- 200°C --, therefor.

In column 3, line 24, delete "(DOM)" and insert -- (DCM) --, therefor.

In column 5, line 6, delete "glycolbutyl" and insert -- glycol-butyl --, therefor.

In column 8, line 23, after "opto-electronic" delete "electronic".

Signed and Sealed this

Sixteenth Day of June, 2009

JOHN DOLL  
*Acting Director of the United States Patent and Trademark Office*